United States Patent [19]

Burton

[11] Patent Number: 4,722,908

[45] Date of Patent: Feb. 2, 1988

[54] FABRICATION OF A BIPOLAR TRANSISTOR WITH A POLYSILICON RIBBON

[75] Inventor: Gregory N. Burton, Burlingame, Calif.

[73] Assignee: Fairchild Semiconductor Corporation, Cupertino, Calif.

[21] Appl. No.: 901,501

[22] Filed: Aug. 28, 1986

[51] Int. Cl.⁴ .................. H01L 21/31; H01L 21/22; H01L 21/265; H01L 21/302

[52] U.S. Cl. .................................. 437/31; 437/152; 437/160; 437/161; 437/162; 437/168; 437/191; 437/200; 357/34

[58] Field of Search ............. 29/571, 576 W; 148/1.5, 148/187, DIG. 11, DIG. 123, 188; 357/34, 59

[56] References Cited

U.S. PATENT DOCUMENTS

| | | | |
|---|---|---|---|
| 4,157,269 | 6/1979 | Ning et al. | 29/577 R |
| 4,343,080 | 8/1982 | Hataishi et al. | 29/571 |
| 4,464,212 | 8/1984 | Bhatia et al. | 148/188 |
| 4,531,282 | 7/1985 | Sakai et al. | 148/188 |
| 4,545,114 | 10/1985 | Ito et al. | 148/1.5 |
| 4,555,842 | 12/1985 | Levinstein et al. | 148/187 |
| 4,583,106 | 4/1986 | Anantha et al. | 357/35 |
| 4,599,789 | 7/1986 | Gasner | 148/187 |

Primary Examiner—Brian E. Hearn
Assistant Examiner—Chi-Tso Huang
Attorney, Agent, or Firm—Stephen J. Phillips; David H. Carroll; James A. LaBarre

[57] ABSTRACT

In the fabrication of bipolar transistors by the single poly process, polysilicon sidewalls are formed along portions of a polysilicon layer that functions as a device contact. The sidewalls serve both as dopant sources which determine the width of underlying base and emitter regions, and as contacts to those devices. Since the thickness of the polysilicon sidewalls, and hence the width of the underlying device regions, are precisely controllable through conventional polysilicon deposition techniques, relatively relaxed design rules can be employed while making possible the formation of emitters having widths less than one-half of a micron.

6 Claims, 7 Drawing Figures

FABRICATION OF A BIPOLAR TRANSISTOR WITH A POLYSILICON RIBBON

BACKGROUND OF THE INVENTION

The present invention is directed to the fabrication of bipolar transistors, and in particular is concerned with a fabrication technology which is known as the "bipolar single poly process."

This technology is basically characterized by the use of a single polysilicon layer which forms the device contact to each of the collector, base and emitter of the transistor, as well as to provide local connection among transistors. The technology is based upon 2 $\mu$m (nominal) design tolerance rules and offers gate delays in the range of 170-200 psec. Among the reasons for its popularity are the fact that it provides self-aligned device contacts, self-aligned local interconnects and polysilicon emitters, which afford enhanced yields and high gain transistor action.

A limiting factor in the speed that can be obtained with devices manufactured according to this technology is the size of the emitter. It is desirable to make the emitter as small as possible, to thereby reduce parasitic capacitances and increase the speed of operation of the transistor. In order to reduce the size of the emitter below that available with conventional optical equipment that affords design dimensions in the range of 1-2 $\mu$m, it becomes necessary to use exotic photolithography equipment, such as x-ray or electron beam devices.

OBJECTS AND BRIEF STATEMENT OF THE INVENTION

It is an object of the present invention to provide an improvement to the bipolar single poly process that retains all the positive attributes of this technology and which enables emitters having widths well below one micron to be obtained.

Along these lines, it is a further object of the invention to enable small emitter widths to be obtained while maintaining relaxed design rules and without the need for expensive photolithographic procedures.

In accordance with the present invention, these objects are obtained by providing polysilicon sidewalls along portions of the polysilicon layer that forms the device contacts. Each sidewall functions both as a dopant source which determines the width of an underlying device, e.g. emitter, during fabrication and subsequently as a contact to this device in the final structure. Since the thickness of the polysilicon sidewalls, and hence the width of the underlying device regions, are precisely controllable through appropriate regulation of a thin film polysilicon deposition process, relatively relaxed design rules in the range of 1-2 $\mu$m can be employed while making possible the formation of emitters having sub-micron and even sub-half-micron widths.

Among other advantages of the present invention, it involves very little modification of the basic single poly process, and hence can be easily incorporated into existing manufacturing techniques. Furthermore, the structure which results from the fabrication process of the present invention enables a wide contact region to be coupled to the small width device, and hence presents relatively low emitter resistance.

Further details of the present invention, and the advantages offered thereby, are described hereinafter with reference to a preferred embodiment of the invention illustrated in the accompanying drawings.

DESCRIPTION OF THE ILLUSTRATED EMBODIMENT

Figure 1:
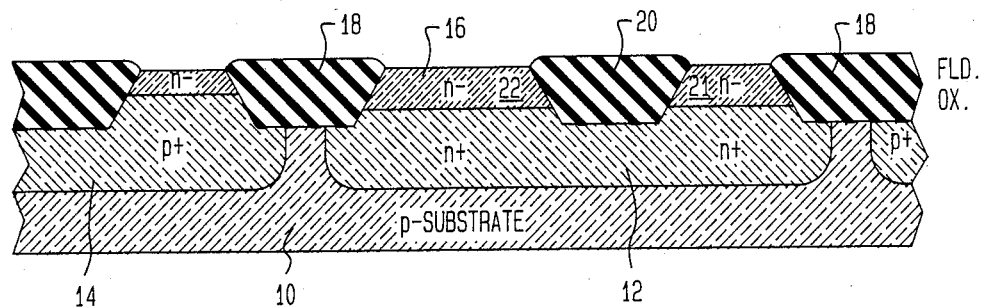
FIGS. 1-7 are cross-sectional side views of a silicon wafer at sequential times during the fabrication of a vertical NPN transistor in accordance with the present invention.

With reference to FIG. 1, the initial steps in the fabrication of a transistor according to the bipolar single poly process involve implanting a suitable impurity, such as arsenic, into a silicon substrate 10 to form an n+ buried layer 12 in one portion of the substrate, and implanting an impurity of opposite conductivity, such as boron, to form a p+ field region 14. An epitaxial layer 16 is then grown or deposited on the substrate to a thickness of about 1-1.5 $\mu$m. The epitaxial layer can be undoped when formed and then subsequently given a light implant of a suitable impurity, for example phosphorous, to form it into an n-type material. Alternatively, the epitaxial layer could be doped as it is being deposited, thereby avoiding the need for a subsequent implanting step. The epitaxial layer is then suitably etched and oxidized to provide regions of field oxidation 18 as well as an area of isolation oxidation 20 which separates the collector and base regions 21,22 of the epitaxial layer from one another. After these steps, the silicon wafer has a structure which appears as shown in FIG. 1.

Figure 2:
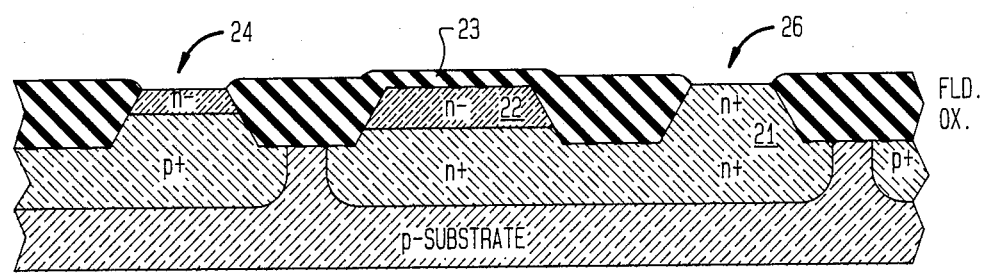

Referring now to FIG. 2, the wafer is oxidized to provide a layer 23 of silicon dioxide having a thickness of about 1000-1500 angstroms. This layer is then suitably etched to open a substrate tap 24 which exposes a region of the epitaxial layer over the p+ field implant 14 and a buried layer tap 26 which exposes the collector region over the n+ buried layer 12. The base region remains covered by the thin oxide layer 23. Additional phosphorous or arsenic is implanted through the buried layer tap 26 to increase the concentration of impurities in the exposed collector region.

Figure 3:
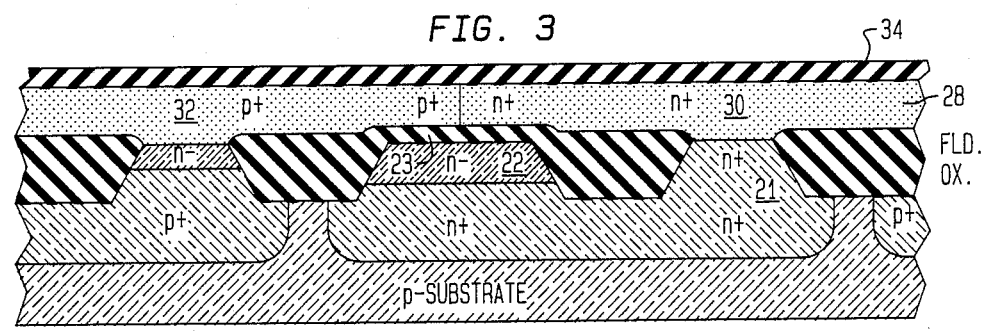

With reference to FIG. 3, a layer of polycrystalline silicon 28 is deposited on the wafer to a thickness of about 4500 angstroms. If desired, a thin layer of oxide, e.g. about 200 angstroms thick, can be formed on the polysilicon layer 28. The polysilicon layer is then suitably masked and a donor impurity is implanted into the polysilicon layer so that a portion 30 of this layer has an n-type conductivity. A complementary mask is then formed over the polysilicon layer and the remaining portion 32 is implanted with an acceptor impurity to give this remaining portion a p-type conductivity. As can be seen in FIG. 3, the n-type and p-type portions of the polysilicon layer are arranged so that each portion partially overlies the covered base region disposed under the silicon dioxide layer 23. The n-type portion 30 of the polysilicon layer completely overlies the collector region, and the p-type portion 32 of the polysilicon layer overlies the substrate tap 24. For reasons which will become apparent hereinafter, the precise location of the boundary between the n-type and p-type portions of the polysilicon layer is not particularly critical, but it is preferably located at about the center of the base region which is covered by the oxide layer 23.

After the polysilicon layer 28 has been appropriately doped, a nitride layer 34 is deposited on it.

Figure 4:
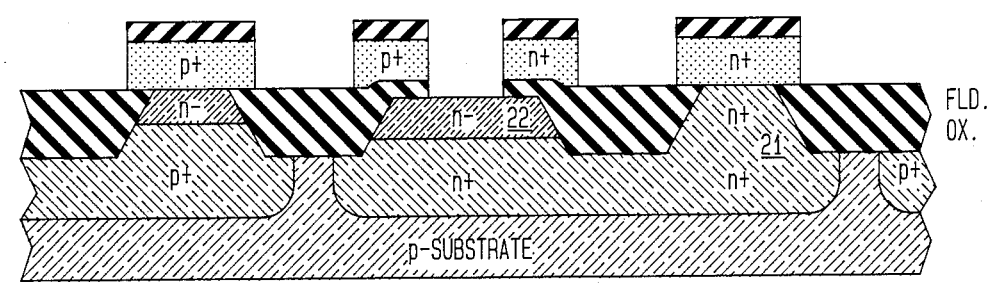
Figure 5:
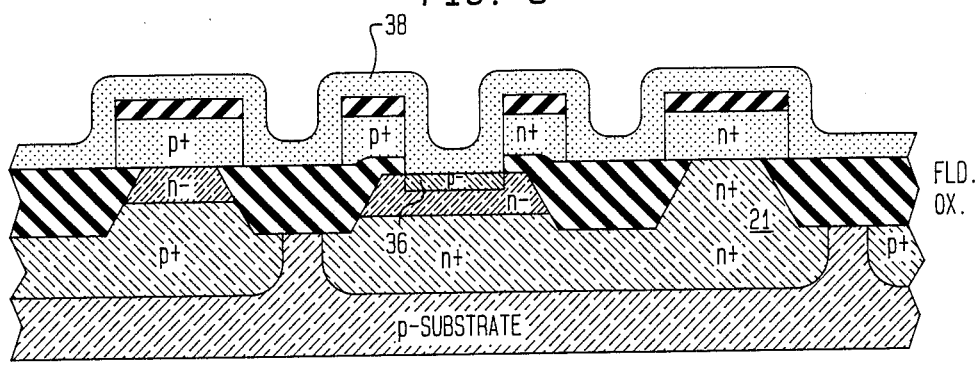

Referring now to FIG. 4, a poly definition mask (not shown) is formed on the nitride layer 34. The nitride layer and the polysilicon layer are then suitably etched to divide these layers into stripes. As can be seen from the figure, a stripe of n-type conductivity overlies the buried layer tap 26 and a stripe of p-type conductivity overlies the substrate tap 24. In addition, a stripe of each conductivity is disposed on respective opposite sides of the base region. The etching of the polysilicon layer in this fashion removes the boundary area between the two portions of opposite conductivity and separates the two opposite conductivity stripes from one another.

A dry oxide etch, i.e. an anisotropic etch, is also carried out to remove the oxide from the isolation island 23 between the two polysilicon stripes of opposite conductivity. At this point in the process the wafer has a construction as shown in FIG. 4.

Figure 6:
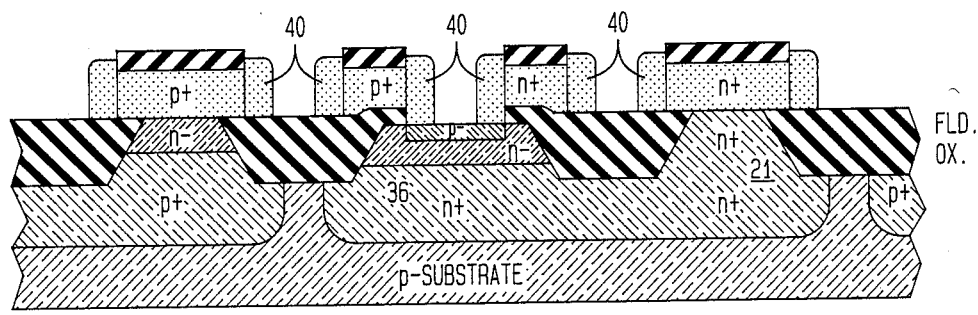

A light dose of boron, or other acceptor impurity, is then implanted into the epitaxial layer to form an intrinsic base region 36. A second layer of polysilicon 38 is then deposited over the entire structure. This second layer is anisotropically etched to remove those portions of the layer which are generally horizontally disposed but to leave intact the vertically disposed portions. The resulting structure has an appearance as shown in FIG. 6. Polysilicon sidewall ribbons 40 are formed along the sides of each of the polysilicon stripes as a result of the anisotropic etching. In addition, the central portion of the base region 36 is again exposed.

Figure 7:
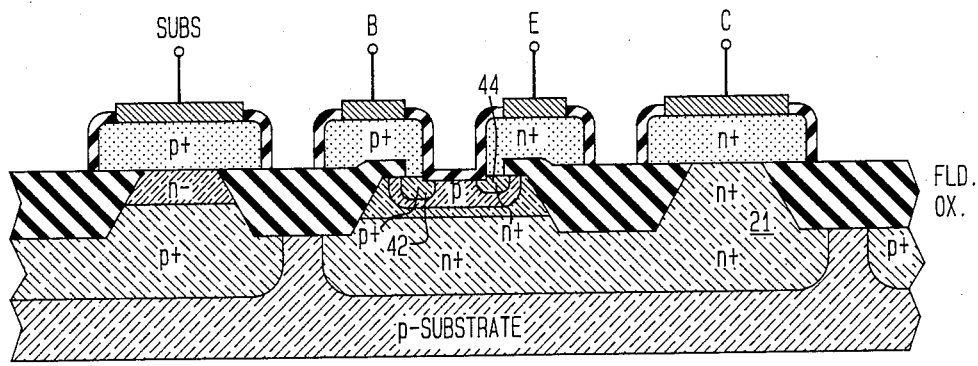

The wafer is then annealed, for example for 30 minutes at a temperature of 950° C. in a nitrogen atmosphere. The annealing causes the impurities in the polysilicon stripes to diffuse into the previously undoped polysilicon sidewall ribbons. In addition, these impurities diffuse into the region of the intrinsic base implant to form an extrinsic p+ base region 42 and an n+ emitter region 44 (see FIG. 7).

To complete the formation of the transistor, the polysilicon sidewall ribbons are oxidized, for example at 850° C. for 75 minutes in an atmosphere of hydrogen and oxygen. The remaining nitride layer 34 is then removed and a wet oxide etch can be carried out to remove any cap oxide layer over the polysilicon. Titanium is deposited on the structure and undergoes a first silicide reaction, for example by means of a heat pulse. A wet titanium etch is carried out to remove any unreacted titanium from the oxide regions, and then a second heat pulse reaction is carried out to reduce the sheet resistance of the titanium silicide regions. Subsequently, metal contacts are deposited on the silicided regions through conventional masking and etching techniques, to provide electrical connections to the base, emitter and collector regions of the transistor.

From the foregoing it will be appreciated that the polysilicon sidewall ribbons function both as dopant sources for the formation of the emitter and extrinsic base regions, as well as contacts to these device regions in the final structure. The width of the emitter is controlled by the thickness of the sidewall ribbon, rather than a mask. Since this thickness can be very precisely determined through appropriate regulation of the thickness of the polysilicon layer 38 as it is being deposited, it will be appreciated that small emitter areas can be formed using well known and conventional process steps. Thus, relatively relaxed design rules, in the range of 1-2 $\mu$m, can still be employed even though small emitter areas are formed.

It is estimated that the degree of control that is provided by the present invention will enable emitter widths in the range of 500 angstroms plus or minus 50 angstroms to be consistently attained. At the same time, although the emitter widths themselves are small, a relatively wide region of silicided polysilicon is available for coupling into the sub-micron device, thereby offering low emitter resistance.

Along with the small emitter width, another factor which contributes to the increased speed of transistors fabricated according to the present invention is the fact that the area of the base implant is smaller than that of conventional processes. More particularly, this area is limited by the size of the window in the silicon dioxide layer 23, rather than covering the entire region 22 between the oxide portions 18 and 20, as in the past.

It is estimated that transistors which are made in accordance with the foregoing principles should offer gate delays of only about 70 psec. In addition, improved packing density can be obtained with the structure that is provided by the present invention without reducing design tolerances.

It will be appreciated by those of ordinary skill in the art that the present invention can be embodied in other specific forms without departing from the spirit or essential characteristics thereof. For example, although the invention is particularly disclosed with regard to the fabrication of a vertical NPN bipolar transistor, it will be readily apparent that it is equally applicable to the formation of PNP transistors. Furthermore, the performance and packing density of the resulting structure might be even further improved by utilizing smaller dimension design rules or through the application of more effective isolation techniques such as trench isolation or silicon-on-insulator technologies. Other known variations of the standard single poly process can also be employed in the context of the invention.

Accordingly, the presently disclosed embodiment is considered in all respects to be illustrative and not restrictive. The scope of the invention is indicated by the appended claims rather than the foregoing description, and all changes that come within the meaning and range of equivalence thereof are intended to be embraced therein.

What is claimed is:

1. A process for fabricating components of a bipolar transistor, comprising the steps of:
    forming on a silicon wafer a layer of polycrystalline silicon in which one portion of said layer is of one conductivity type and an adjacent portion of said layer is of opposite conductivity type;
    exposing an area of said silicon wafer which defines a device region between said adjacent portions of said polycrystalline silicon layer;
    forming a polysilicon sidewall along each of said adjacent portions of said polycrystalline silicon layer and in contact with said device region;
    annealing said wafer to cause impurities in each of said portions of said polycrystalline silicon layer to diffuse into the sidewall along that portion and into said device region, and thereby form emitter and base areas in said device region; and
    providing contacts on said adjacent portions of said polycrystalline silicon layer to thereby establish electrical connection to said base and emitter areas.

2. The process of claim 1 wherein said device region is formed in an epitaxial layer of said one conductivity type in said wafer and wherein said wafer includes a buried layer of said one conductivity type disposed below said epitaxial layer, and said process further includes the steps of forming a third portion of said polycrystalline layer, having said one conductivity type, on a region of said wafer that is in electrical contact with said buried layer, and providing a contact on said third portion to thereby form the collector of said transistor.

3. The process of claim 2 wherein said wafer also includes a buried layer of said opposite conductivity type, and said process includes the steps of forming a fourth portion of said polycrystalline layer on a region of said wafer that is in electrical contact with said opposite conductivity buried layer, and providing a contact on said fourth portion to enable the substrate of said wafer to be electrically biased.

4. A process for fabricating a transistor with the use of a single polysilicon device contact layer, comprising the steps of:
   forming a buried layer and an epitaxial layer of one conductivity on a silicon substrate;
   electrically isolating two regions of said epitaxial layer from one another;
   covering one of said regions with a layer of insulation while leaving the other of said regions exposed;
   depositing a first layer of polycrystalline silicon over said layer of insulation and said exposed region of said epitaxial layer;
   doping one portion of said polycrystalline layer to be a first conductivity and another portion of said polycrystalline layer to be a second conductivity, such that each of said two portions partially overlies said one region of said epitaxial layer and only one of said two portions overlies said other region;
   forming a first opening in said first polycrystalline layer and in said insulation layer to separate said two portions from one another and to expose said one region;
   forming a second opening in said polycrystalline layer to isolate a part of said one portion which partially overlies said one region from another part of said portion which overlies said other region;
   depositing a second layer of polycrystalline at least within said first opening;
   anisotropically etching said second layer to expose a portion of said one region and form polycrystalline silicon sidewall ribbons that are respectively disposed on said separated portions of said first layer and in contact with said one region;
   diffusing impurities from each of said two separated portions of said first layer into the respective sidewall ribbons disposed on said portions and into the areas of said one region that are in contact with said sidewall ribbons such that a base and an emitter are formed in said one region and said sidewalls respectively form electrical connections to said base and emitter; and
   providing electrical contact regions on each of said two parts of said one portion of said first layer and on said other portion of said first layer.

5. A method for controlling the size of a device region that is formed in a layer of silicon, comprising the steps of:
   depositing polycrystalline silicon on said layer of silicon;
   etching said polycrystalline silicon to remove some of said polycrystalline silicon from said layer of silicon so that the portion of polycrystalline silicon that remains in contact with said layer of silicon has a width corresponding to a desired width for the device region; and
   diffusing impurities from said remaining portion of said polycrystalline silicon into said silicon layer to thereby form said device region.

6. A method for forming a device area of controlled width in silicon, comprising the steps of:
   providing an insulating layer on said silicon;
   forming a layer of doped polysilicon on said insulating layer;
   removing a portion of said polysilicon layer and said insulating layer so that said silicon is exposed and a sidewall is formed in said polysilicon layer and insulating layer;
   forming a layer of an undoped polysilicon over said doped polysilicon and in contact with said exposed silicon;
   anisotropically etching said layer of undoped polysilicon to form a ribbon along said sidewall that has a thickness which defines a desired width for a device in said silicon; and
   diffusing impurities from said doped polysilicon layer through said ribbon and into said exposed silicon to thereby form said device area.

* * * * *